US006967492B2

(12) United States Patent
Tsui et al.

(10) Patent No.: US 6,967,492 B2
(45) Date of Patent: Nov. 22, 2005

(54) SPRING CONTACT PROBE DEVICE FOR ELECTRICAL TESTING

(75) Inventors: Ching Man Stanley Tsui, Kwai Chung (HK); Chak Tong Albert Sze, Kwai Chung (HK); Shu Kei Dennis Chan, Kwai Chung (HK); Sai Kit Jonathan Wong, Kwai Chung (HK)

(73) Assignee: ASM Assembly Automation Ltd., Hong Kong (HK)

( * ) Notice: Subject to any disclaimer, the term of this patent is extended or adjusted under 35 U.S.C. 154(b) by 18 days.

(21) Appl. No.: 10/722,635

(22) Filed: Nov. 26, 2003

(65) Prior Publication Data

US 2005/0110505 A1 May 26, 2005

(51) Int. Cl.[7] .............................................. G01R 31/02
(52) U.S. Cl. ........................................ 324/754; 324/758
(58) Field of Search ................................. 324/754, 758, 324/761–762, 72.5; 439/482, 700, 824

(56) References Cited

U.S. PATENT DOCUMENTS

| 4,307,928 A | * | 12/1981 | Petlock, Jr. ................. 324/754 |
| 4,438,397 A | * | 3/1984 | Katz .......................... 324/761 |
| 4,773,877 A | * | 9/1988 | Kruger et al. ............... 324/761 |
| 4,783,624 A | * | 11/1988 | Sabin ......................... 324/758 |
| 4,801,879 A | * | 1/1989 | Spicer ........................ 324/751 |
| 5,175,493 A | * | 12/1992 | Langgard ..................... 324/761 |
| 5,570,033 A | * | 10/1996 | Staab .......................... 324/761 |
| 5,585,739 A | * | 12/1996 | Staab .......................... 324/761 |
| 5,667,410 A | * | 9/1997 | Johnston ..................... 324/761 |
| 5,818,248 A | * | 10/1998 | St. Onge ..................... 324/761 |
| 5,936,421 A | * | 8/1999 | Stowers et al. ............. 324/761 |
| 6,401,048 B2 | * | 6/2002 | Caggiano et al. ........... 324/763 |
| 6,570,399 B2 | * | 5/2003 | Yeghiayan et al. ......... 324/761 |

FOREIGN PATENT DOCUMENTS

JP          58005666 A  *  1/1983  ........... G01R/31/02

* cited by examiner

*Primary Examiner*—David Zarneke
*Assistant Examiner*—Jermele Hollington
(74) *Attorney, Agent, or Firm*—Ostrolenk, Faber, Gerb & Soffen, LLP

(57) ABSTRACT

The invention provides a unitary spring contact probe comprising a resilient spring section, a plunger section extending from a distal end of the resilient spring section for contacting a semiconductor device under test and a stopper projecting from the plunger section substantially transversely to an axial direction of the plunger section. There is also provided an apparatus for testing a semiconductor comprising a plurality of said unitary spring contact probes, one or more insulative guiding holders for mounting the spring contact probes, and a retainer mechanism coupled to the stoppers of the spring contact probes for securing the spring contact probes to the insulative guiding holders.

19 Claims, 4 Drawing Sheets

SPRING CONTACT PROBE DEVICE FOR ELECTRICAL TESTING

FIELD OF THE INVENTION

The present invention relates to electrical contact probes, and more specifically to spring probes used in electrical testing of high-powered semiconductor devices.

BACKGROUND AND PRIOR ART

Semiconductor chips or integrated circuits ("ICs") used in semiconductor devices are initially fabricated on wafers. After fabrication the wafers are then cut to separate the semiconductor chips, after which the semiconductor chips are usually assembled into packages to protect them from mechanical stress. In general, the package assembly process includes mounting a plurality of the semiconductor chips from the wafer onto a carrier such as a leadframe, forming wire bonds between the semiconductor chips and the leadframe and then encapsulating the semiconductor chips with a molding compound. Following molding, the leadframe with encapsulated semiconductor chips is trimmed, formed and the semiconductor chips are separated into individual packaged semiconductor devices. This is commonly referred to as a singulated semiconductor device.

After packaging, the semiconductor devices have to be electrically tested to make sure they are free of any manufacturing defects. Presently, packaged semiconductor devices may be electrically tested after a trim process, as the devices are electrically isolated after trimming, but retain their relative positions on the carrier. This method of testing allows a plurality of semiconductor devices to be contacted and tested at the same time so as to improve testing efficiency. Alternatively and more commonly, semiconductor devices may be tested when they are in singulated form. However, even in singulated form, semiconductor devices may be arranged in a matrix or array format onto a carrier device and then presented to a tester. This method also facilitates a plurality of semiconductor devices to be contacted and tested at the same time.

In these two methods of testing, the test interface typically employed between the tester and the semiconductor devices under test consists of densely populated spring-loaded contact probes housed within an mounting block. The spring-loaded contact probes provide an electrical interface between the tester resources and the electrical contacts or leads of the devices under test. A standard spring loaded contact probe typically consists of a barrel, an internal spring and a moveable plunger at each end of the barrel. The plunger tip at one end of the barrel is to make contact with an interface board of the tester device ("Device Interface Board") while the plunger tip at the other end of the barrel is used to contact the electrical leads of the devices under test. The plunger tip when in contact with the device is compressed further by a certain travel distance to provide the required spring force to penetrate oxides on the lead to thereby ensure reliable contact.

While the spring-loaded contact probe can cater to quite a number of testing applications, the current carrying capacity of the spring-loaded probe is mostly inadequate for testing high power devices. It was found that when a very high pulse current (for example, 200 Amperes at 1 millisecond pulse rate) is injected through a spring loaded contact probe, hot spot regions are found at the plunger, barrel and spring interfaces. Common problems encountered include melting at the interfaces and spring collapse with stuck pins being a common occurrence. It would be desirable to introduce a one-piece contact probe design for minimizing a risk of failure of the probe at its interfaces.

U.S. Pat. No. 5,667,410 for a "One-Piece Compliant Probe" discloses a contact probe for an electronic tester in which the probe includes a one-piece contact probe having a plunger member and a compliant spring section contained in and guided for spring biased axial travel in a tubular outer barrel. The plunger member, spring section and barrel are jointly formed of a single integral spring metal piece. The purpose of this invention is to provide a solid metal compliant electrical connector for carrying high loads subjected to constant cycling. However, a drawback of such a contact probe is that it is made from sheet material, thereby occupying a relatively larger area as a whole when assembled. Another disadvantage is that it has only one plunger member. It would thus not be as flexible as a double-ended contact probe which can contact both the device under test on one end and the Device Interface Board connected to testing resources on the other end. In addition, by housing the spring metal piece within a barrel, the sliding contact between plunger/spring and barrel under very high current pulses will still cause hot spot regions and melting at the interface like conventional spring probes. This may dramatically reduce the lifetime of the probe.

SUMMARY OF THE INVENTION

It is therefore an object of this invention to provide a unitary spring probe that can be used for high-power device applications which overcomes some of the disadvantages of the prior art. It is also an object of this invention to enable the adoption of a spring probe in a high-density configuration for testing a plurality of semiconductor devices.

According to a first aspect of the invention, there is provided a unitary spring contact probe comprising a resilient spring section, a plunger section extending from a distal end of the resilient spring section for contacting a semiconductor device under test and a stopper projecting from the plunger section substantially transversely to an axial direction of the plunger section.

According to a second aspect of the invention, there is provided an apparatus for testing a semiconductor device comprising: a plurality of unitary spring contact probes each comprising a resilient spring section, a plunger section extending from a distal end of the resilient spring section for contacting a semiconductor device under test and a stopper projecting from the plunger section substantially transversely to an axial direction of the plunger section; one or more insulative guiding holders for mounting the spring contact probes; and a retainer mechanism coupled to the stoppers of the spring contact probes for securing the spring contact probes to the insulative guiding holders.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a preferred embodiment of a spring probe in accordance with the invention will now be described with reference to the accompanying drawings, in which.

DETAILED DESCRIPTION OF THE PREFERRED EMBODIMENT OF THE INVENTION

Figure 1:
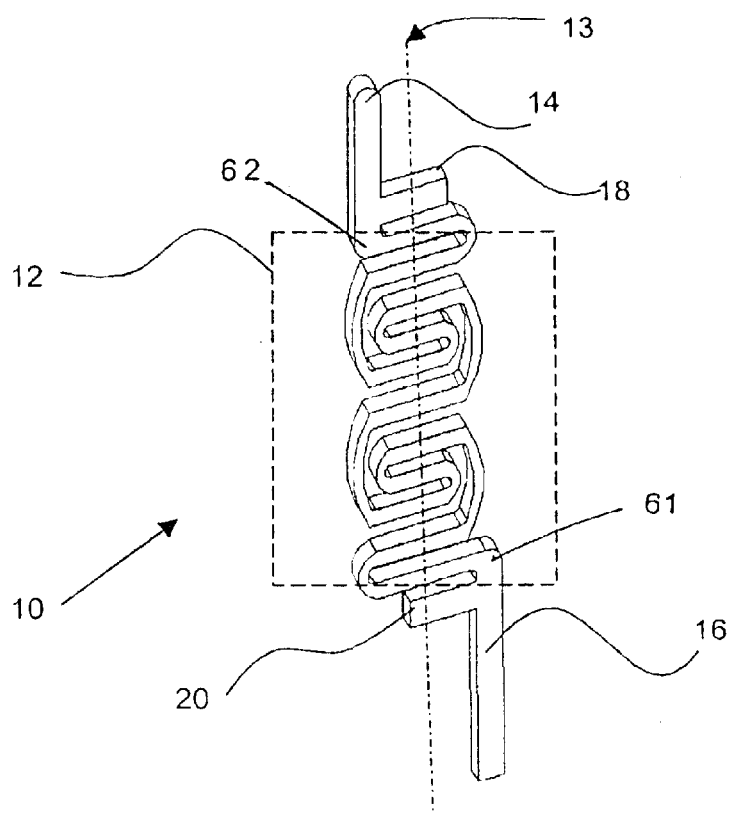
FIG. 1 is an isometric view of a spring probe according to the preferred embodiment of the invention.

FIG. 1 is an isometric view of a spring probe 10 according to a preferred embodiment of the invention. It comprises a unitary body comprising a resilient spring section 12, a plunger section 16 extending from a distal end 61 of the resilient spring section 12 for contacting a semiconductor device under test and a stopper 20 projecting from the plunger section 16 substantially transversely to an axial direction of the plunger section 16. The probe 10 may be formed from a wire-like material. Generally, the wire-like material has a form akin to a flexible metallic thread or slender rod.

The spring probe 10 has a second plunger section 14 at a proximal end 62 of the spring section 12 that is opposite to the plunger section 16. The second plunger section 14 extends out of the spring section 12 in a substantially straight line in the same general axial direction as the spring section 12. It is preferable for the second plunger section 14 to extend substantially parallel to the plunger section 16 when the spring section 12 is uncompressed. Also, it is advantageous for the second plunger section 14 and the plunger section 16 to lie on opposite sides of an axial plane passing perpendicularly through a center 13 of the spring section 12. This allows the plunger sections 16 of two opposing spring probes 10 to contact points that closer together when they are arranged next to each other as mirror images of each other. Generally, the plunger sections 14, 16 are aligned asymmetrically about an axis of rotation when the plunger sections 14, 16 are biased and the spring section 12 is uncompressed.

There is a stopper 18, 20 along each of the plunger sections 14, 16 of the spring probe 10, projecting from each plunger section substantially transversely to an axial direction of the plunger section 14, 16. The stoppers 18, 20 are configured to be coupled to or pressed against retaining mechanisms to aid in securing and keeping the spring probe body in position when disposed in a test contactor 22 (see FIG. 3). They also ensure that the spring section can be compressed freely when axial forces are applied at the plunger tips.

The stoppers 18, 20 also function as a thermal device to facilitate heat dissipation. In electrical contacts of the spring probe 10, due to the random roughness and oxide thickness of the contacting surface, the actual contact area may be significantly smaller than a probe mark area made by the tip of the plunger section 16. This actual contact area includes inter-metallic contact areas, which are commonly referred to as "a-Spots". During testing, current flow lines are forced through the a-Spots, which can result in localized Joule heating at the plunger tip and can cause a considerable rise in the localized temperature, especially under high current loading. This has two major effects. The first effect is the heating up of the device-under-test which is undesirable for ambient testing. Secondly, the heat can also cause excessive heating of the spring section 12, which may affect its mechanical properties. In this case, the stoppers 18, 20, as thermal devices positioned within a purge air region will conduct heat away from both the plunger tip and spring section area, which helps to keep the device temperature closer to the ambient temperature and also to protect the spring section 12. Hence, the stopper is configured with a sufficiently large surface area so as to act as a thermal device for facilitating the dissipation of heat from the spring contact probe.

For high temperature testing, an additional thermal device can be positioned near to the tip of the plunger section 16 such that it is exposed to ambient air. In this case, the thermal device will be heated up to the environment temperature and act as a further heat dissipation source to maintain the tip of the plunger section 16 at the environment temperature.

In a particularly preferred embodiment, the distance between the two stoppers 18, 20 is approximately 65% of the total length of the spring probe 10. Therefore, where the total length of the spring probe 10 is 32 millimeters, this distance is 21 millimeters. Further, the distance between each stopper 18, 20 to an adjacent plunger tip end is approximately 17% of the total length of the spring probe 10. Therefore, where the total length of the spring probe is 32 millimeters, the distance is 5.5 mm at each end.

It is also preferable that the spring section 12 within the probe 10 is able to provide a predetermined compression force between the plunger tip end of the probe 10 and the device under test to ensure good electrical contact between them. The tip end may comprise a number of different geometric configurations such as tapered, wedged, rounded or flat and the like, depending on the particular device under test. The probe 10 is also designed with a sufficiently large cross sectional area to handle high current pulse without excessive overheating.

As illustrated in FIG. 1, it is preferable that at least the spring section 12, plunger section 16 and stopper 20 are fashioned from a single strip of material, such as by cutting the requisite shape from a large piece of material, although separate strips of material may also be joined or fused together to form the spring probe 10. Similarly, it is also preferable that the plunger section 16 and the second plunger section 14 are fashioned from a single strip of material.

The spring probe 10 may be made from an electrically conductive material such as copper or beryllium copper. Additionally, the base metal may be plated with Nickel, Palladium, hard Gold and/or Rhodium to improve the rigidity and electrical conductivity of the probe 10.

Figure 2:
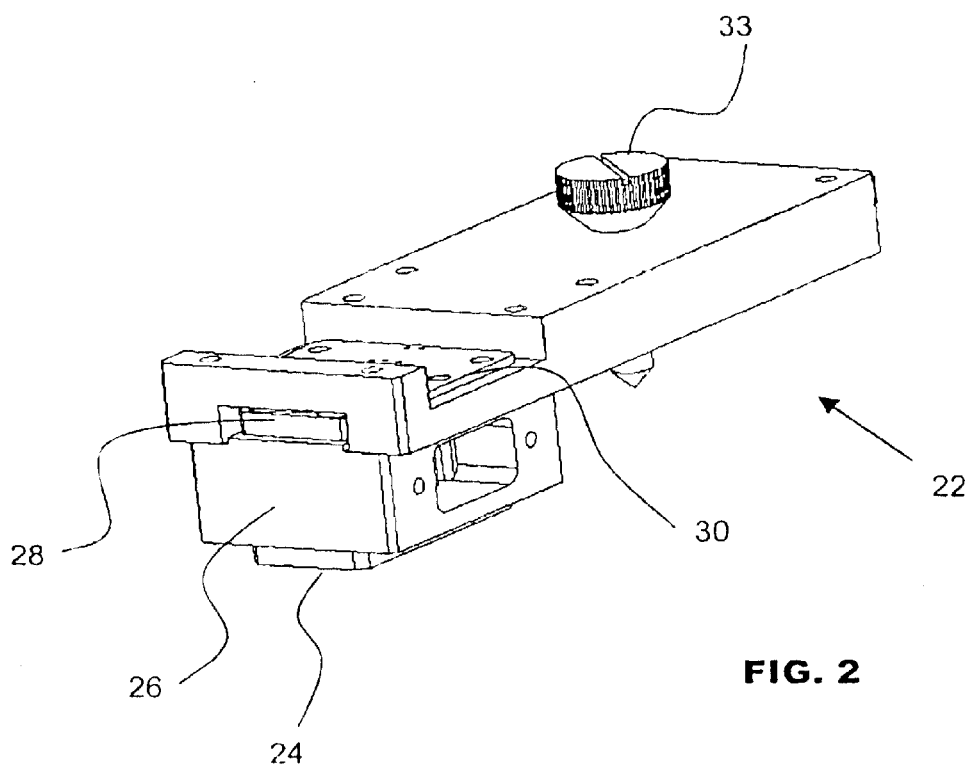
FIG. 2 is an embodiment of a test contactor to which the spring probe is mountable.
Figure 3:
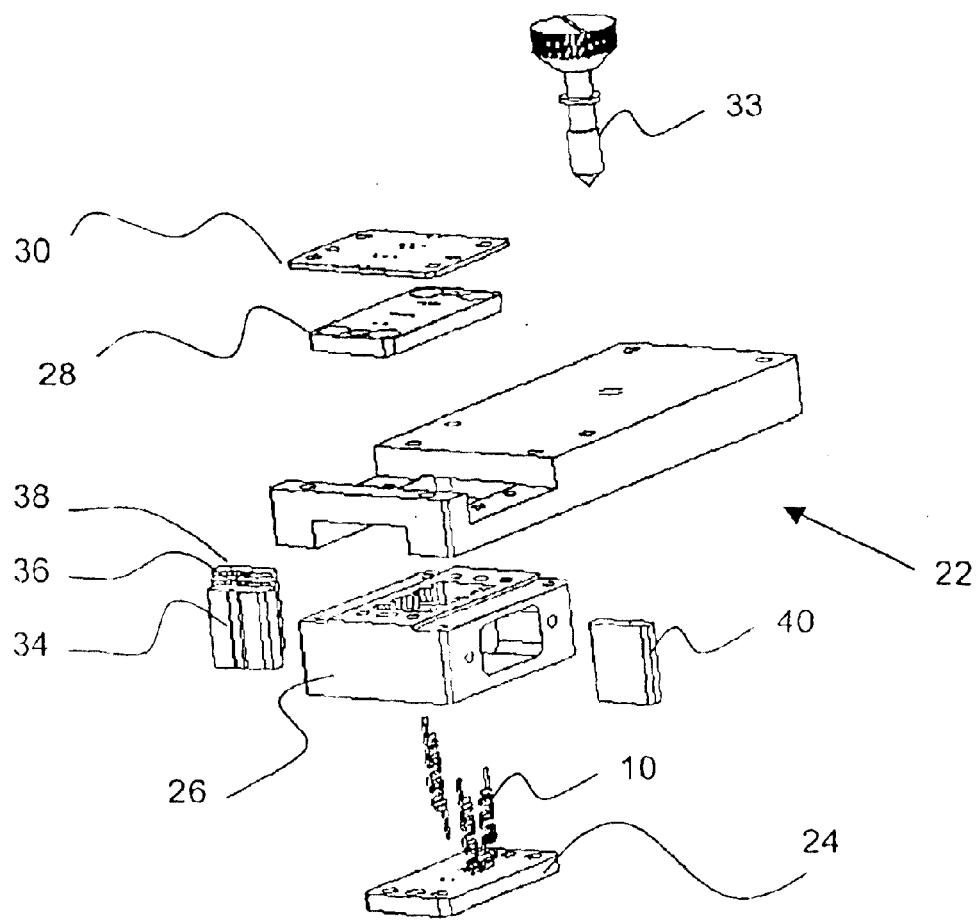
FIG. 3 is an exploded view of the test contactor of FIG. 2 including the spring probe.

FIG. 2 is an embodiment of a test contactor 22 to which the spring probe 10 is mountable. FIG. 3 is an exploded view of the test contactor 22 of FIG. 2 including the spring probes 10. The test contactor 22 is used to perform electrical tests on a semiconductor device, and in particular a high-powered semiconductor device. The semiconductor device under test is commonly referred to as a device under test or a DUT 52 (see FIG. 4). In a preferred embodiment, the test contactor 22 consists of a plurality of spring probes 10 vertically disposed within a holder, which may comprise a spring probe guide block holder 26 for holding one or more insulative guiding holders, such as four spring probe guide blocks 34, 36, 38, 40. Retainer mechanisms such as a bottom retainer plate 24 and a top retainer plate 28 are used for securing the spring probes 10 to the guide blocks 34, 36, 38, 40.

The guide blocks 34, 36, 38, 40 help to keep the bodies of the spring probes 10 in place. The plunger tip ends of the plunger sections 14, 16 of the probes 10 protrude out from the bottom and top retainer plates 24, 28 through holes formed in the bottom and top retainer plates 24, 28 so that they can make contact with a printed circuit board ("PCB") 30 at the top plate end and a DUT 52 at the bottom plate end. Therefore, the plunger section 16 contacts the DUT 52 whereas the second plunger section 14 contacts the PCB 30. In the embodiment, the PCB 30 has wirings (not shown), which provide an electrical connection between the spring probes 10 and the tester resources. The spring probes 10 are arranged in a predetermined pattern corresponding to the electrical contacts on the DUT 52. There is also a cavity within the spring probe guide block holder 26 and/or guide blocks 34, 36, 38, 40 so that purge air may be introduced into the guide block holder 26 to the spring probes 10. This is to provide an avenue to cool the spring probes 10 as they can reach very high temperatures when subjected to very high pulse current as in high-powered device testing.

Figure 4:
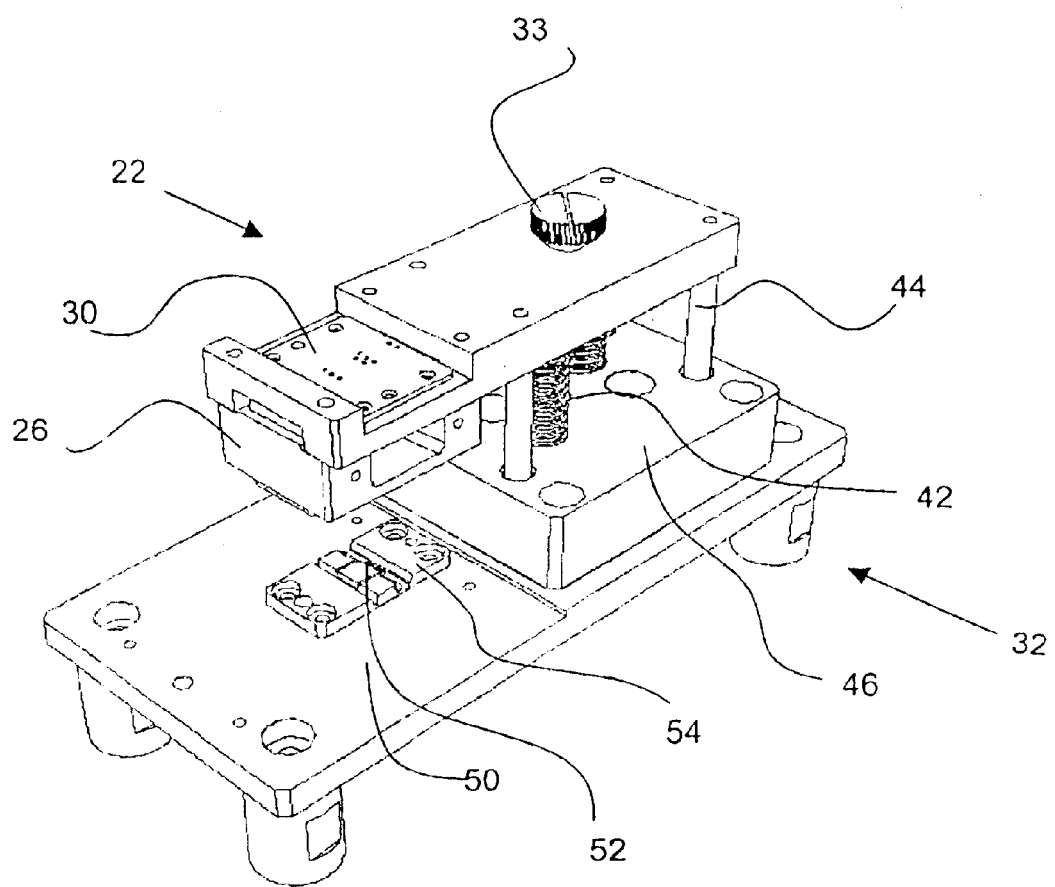
FIG. 4 is an isometric view of a manual test jig including the test contactor of FIG. 2.
Figure 5:
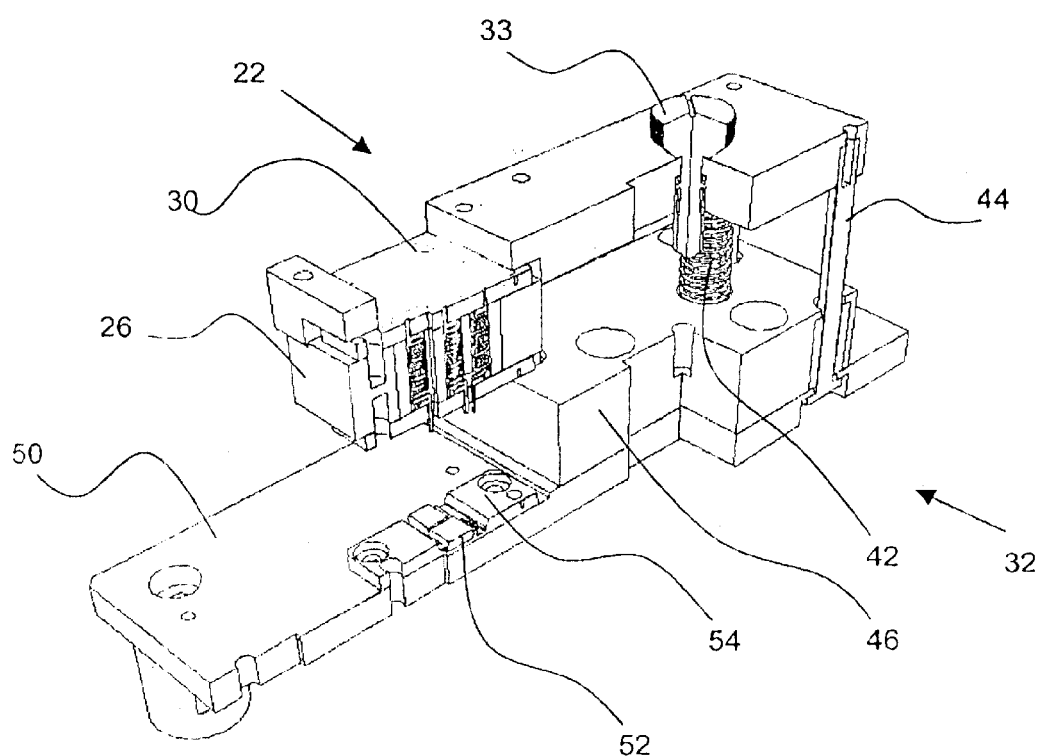
FIG. 5 gives a partial cross-sectional view of the manual test jig of FIG. 4.

FIG. 4 is an isometric view of a manual test jig 32 including the test contactor 22 of FIG. 2. FIG. 5 gives a partial cross-sectional view of the manual test jig 32 of FIG. 4. The manual test jig 32 consists of the test contactor 22 attached to a base plate 46 through four guide rods 44 and two compression springs 42. A package holder 54 for holding the DUT 52 is securely fastened on top of the bottom plate 50. The test contactor 22 may be lowered to make contact with the DUT 52 by pressing it downward and then by securing it with the stainless steel knob fastener 33. Once secured, the test contactor 22 may be lowered further by turning the stainless steel knob fastener 33 until the spring probes 10 are compressed against the electrical contacts of the DUT 52. Testing can then take place by running a test program.

It should be appreciated that the manual test jig 36 as illustrated in FIG. 4 and FIG. 5 is only an example for reference and clarity, and that spring probes constructed according to principles of this invention are also usable with test fixtures configured other than that specifically described and illustrated herein.

The advantages of the invention would be readily apparent from the described embodiment. These include the design not having a metal barrel, thus eliminating the interface-to-interface contact problem between the plunger, barrel and spring as encountered in conventional spring-loaded probes during high power testing. The wire-like material used to manufacture the probes also take up less space as compared to using sheet material. Moreover, the double-ended plungers at either end of the spring section also serve to make the spring probe more flexible.

The invention described herein is susceptible to variations, modifications and/or additions other than those specifically described and it is to be understood that the invention includes all such variations, modifications and/or additions which fall within the spirit and scope of the above description.

What is claimed is:

1. A unitary spring contact probe comprising a resilient spring section, a first plunger section extending from a distal end of the resilient spring section for contacting a semiconductor device under test and a first stopper projecting from the first plunger section substantially transversely to an axial direction of the plunger section;

wherein the resilient spring section, the first plunger section, and the first stopper are formed as a single integral, unitary structure.

2. The spring contact probe as claimed in claim 1, wherein the probe is formed from a wire-like material.

3. The spring contact probe as claimed in claim 1, wherein the spring section, the first plunger section and the first stopper are fashioned from a single strip of material.

4. The spring contact probe as claimed in claim 1, wherein the spring contact probe is made from copper or beryllium copper.

5. The spring contact probe as claimed in claim 4, wherein the spring contact probe is plated with a material selected from the group consisting of nickel, palladium, hard gold and rhodium.

6. The spring contact probe as claimed in claim 1, including a second plunger section at a proximal end of the resilient spring section that is opposite the first plunger section.

7. The spring contact probe as claimed in claim 6, wherein the second plunger section extends out of the spring section in a substantially straight line in the same general axial direction as the spring section.

8. The spring contact probe as claimed in claim 7, wherein the second plunger section extends substantially parallel to the first plunger section when the spring section is uncompressed.

9. The spring contact probe as claimed in claim 6, wherein the first plunger section and the second plunger section lie on opposite sides of an axial plane passing perpendicularly through a center of the spring section.

10. The spring contact probe as claimed in claim 6, wherein the first plunger section and the second plunger section are fashioned from a single strip of material.

11. The spring contact probe as claimed in claim 6, including a second stopper projecting from the second plunger section substantially transversely to an axial direction of the second plunger section.

12. A unitary spring contact probe comprising a resilient spring section, a first plunger section extending from a distal end of the resilient spring section for contacting a semiconductor device under test and a first stopper projecting from the first plunger section substantially transversely to an axial direction of the plunger section;

wherein the first stopper is configured with a sufficiently large surface area so as to act as a thermal device for facilitating the dissipation of heat from the spring contact probe.

13. An apparatus for testing a semiconductor device comprising:

a plurality of unitary spring contact probes each comprising a resilient spring section, a first plunger section extending from a distal end of the resilient spring section for contacting a semiconductor device under test and a first stopper projecting from the first plunger section substantially transversely to an axial direction of the plunger section; wherein the resilient spring section, the first plunger section, and the first stopper are formed as a single integral, unitary structure;

one or more insulative guiding holders for mounting the spring contact probes; and a retainer mechanism coupled to the first stoppers of the spring contact probes for securing the spring contact probes to the insulative guiding holders.

14. The apparatus as claimed in claim 13, wherein the retainer mechanism comprises a retainer plate including holes that allow the first plunger sections of the spring contact probes to protrude from a surface of the retainer plate for contacting the semiconductor device.

15. The apparatus as claimed in claim 13, including cavities in the insulative guiding holders for introducing purging air onto the spring contact probes.

16. The apparatus as claimed in claim 13, including an electrical circuit contacted by an end of the spring contact probe that is opposite the first plunger section, wherein the electrical circuit is coupled to signal processing resources of the apparatus.

17. The apparatus as claimed in claim 16, including a second plunger section at the end of the resilient spring section that is opposite the first plunger section for contacting the electrical circuit.

18. The apparatus as claimed in claim 17, including a second retaining mechanism coupled to a second stopper of each of the spring contact probes projecting from the second plunger sections for securing the spring contact probes to the insulative guiding holders.

19. The apparatus as claimed in claim 18, wherein the second retaining mechanism comprises a retainer plate including holes that allow the second plunger sections of the spring contact probes to protrude from a surface of the second retainer plate for contacting the electrical circuit.

\* \* \* \* \*